United States Patent
Jang

(10) Patent No.: US 8,357,927 B2
(45) Date of Patent: Jan. 22, 2013

(54) SEMICONDUCTOR DEVICE AND METHOD FOR MANUFACTURING THE SAME

(75) Inventor: Chi Hwan Jang, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 243 days.

(21) Appl. No.: 12/834,002

(22) Filed: Jul. 11, 2010

(65) Prior Publication Data

US 2011/0220875 A1    Sep. 15, 2011

(30) Foreign Application Priority Data

Mar. 9, 2010    (KR) .................. 10-2010-0020858

(51) Int. Cl.
*H01L 29/78*    (2006.01)
*H01L 21/336*    (2006.01)

(52) U.S. Cl. ........................................ 257/24

(58) Field of Classification Search ............ 257/24, 257/253, 410, 288, 315, 365, E29.255, E29.3, 257/E29.264, E29.168; 977/742, 774, 734, 977/936–938, 934, 943
See application file for complete search history.

(56) References Cited

U.S. PATENT DOCUMENTS

| | | | |
|---|---|---|---|
| 6,852,582 B2 * | 2/2005 | Wei et al. .................. 438/195 |
| 6,962,839 B2 * | 11/2005 | Wei et al. .................. 438/195 |
| 2006/0252276 A1 * | 11/2006 | Choi et al. ................. 438/775 |
| 2007/0111419 A1 * | 5/2007 | Doyle et al. ................ 438/197 |
| 2007/0228361 A1 * | 10/2007 | Raravikar et al. ............ 257/40 |
| 2008/0241755 A1 * | 10/2008 | Franklin et al. ............ 430/296 |
| 2009/0060827 A1 * | 3/2009 | Vinciguerra et al. ...... 423/447.1 |
| 2010/0009474 A1 * | 1/2010 | Kim et al. .................. 438/20 |
| 2010/0025660 A1 * | 2/2010 | Jain et al. ................... 257/24 |

FOREIGN PATENT DOCUMENTS

| | | |
|---|---|---|
| JP | 2006-272491 A | 10/2006 |
| JP | 2008-091566 | 4/2008 |

\* cited by examiner

*Primary Examiner* — Dao H Nguyen
*Assistant Examiner* — Tram H Nguyen

(57) ABSTRACT

A method for manufacturing a semiconductor device comprises: growing a carbon nano tube on a semiconductor substrate; forming an insulating film in the inside and the outside of the carbon nano tube; and forming a graphene on the surface of the insulating film, thereby securing a channel region corresponding to a region extended by the carbon nano tube to prevent a short channel effect. As a result, channel resistance is reduced to facilitate the manufacturing of the device that can be operated at a high speed. The carbon nano tube is applied to a semiconductor device of less than 30 nm so that a micro-sized semiconductor device can be manufactured regardless of limitation of exposure light sources.

30 Claims, 4 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0020858 filed on Mar. 9, 2010, the disclosure of which is hereby incorporated in its entirety by reference, is claimed.

BACKGROUND OF THE INVENTION

Embodiments of the present invention relates to a semiconductor device and a method for manufacturing the same, and more specifically, to a semiconductor device and a method for manufacturing the same that comprises a gate using a graphene.

Many of today's electronic appliances include a semiconductor device. The semiconductor device includes electronic elements such as a transistor, a resistor and a capacitor. These electronic elements are designed to perform a partial function of the electronic device, and integrated on a semiconductor substrate. For example, electronic devices such as a computer or a digital camera include a memory chip for storing information and a processing chip for controlling information. The memory chip and the processing chip include electronic elements integrated on a semiconductor substrate.

Semiconductor devices are required to be highly integrated in order to satisfy the consumer's demand for excellent performance and inexpensive price. As the integration of the semiconductor memory device has become higher, the design rule has been reduced so that a pattern of the semiconductor device becomes micro-sized. Due to limits in characteristics of silicon material and in the manufacturing process, high integration and high performance of the silicon-based semiconductor device are difficult.

As a result, research on the next generation device has been made to overcome the limits of the silicon-based semiconductor device. For example, a nano structure such as a carbon nano tube (CNT) is applied in order to manufacture a micro-sized device with excellent performance. The carbon nano tube has a diameter in the tens of nano meters, thereby facilitating micronization of the device with high mobility, high electric conductivity, high thermal conductivity and strong mechanical intensity. This carbon nano tube has received much attention to overcome limits of the existing device.

However, since there are problems in applying the carbon nano tube to the semiconductor device, it is difficult to obtain the semiconductor device applied with the carbon nano tube. For example, it is difficult to compose a carbon nano tube with reproducibility and handle the composed carbon nano tube. In order to manufacture a device using a carbon nano tube, a technique of aligning a carbon nano tube in a desired region of a substrate for manufacturing a device. Also, it is difficult to apply a carbon nano tube along with other nano structures in one device, which limits the manufacturing of various high performance devices. As a result, the development of techniques to manufacture a semiconductor device using a carbon nano tube is needed.

Meanwhile, as the design rule of the semiconductor device is reduced, the corresponding channel length is also decreased, which results in a decrease of the channel length of cell transistors as a storage unit as well as transistors of a peripheral circuit. As a result, it is difficult to obtain a target of a threshold voltage (Vt) of a transistor required in a specific device by the existing plannar transistor structure. Although a technique using a three-dimensional gate has been developed in order to overcome the problem, a complicated technique is required to apply the three-dimensional gate, which results in defects.

BRIEF SUMMARY OF THE INVENTION

Various embodiments of the invention are directed to preventing the short channel effect which results from reduction of the channel length due to high integration of the semiconductor device.

According to an embodiment of the present invention, a semiconductor device comprises: a carbon nano tube grown on a substrate; an insulating film formed over an inner surface and an outer surface of the carbon nano tube; and a graphene formed over the surface of the insulating film.

The carbon nano tube is vertically grown over the substrate.

The insulating film includes a high-K dielectric material.

The insulating film includes a zirconium oxide, a lead zirconium titanate (PZT) and a hafnium oxide.

The insulating film includes an oxide film.

The insulating film includes a nitride film.

The insulating film includes a carbonized film.

The graphene includes a mono layer.

The graphene includes a multi layer.

According to an embodiment of the present invention, a method for manufacturing a semiconductor device comprises: growing a carbon nano tube on a substrate; forming an insulating film over an inner surface and an outer surface of the carbon nano tube; and forming a graphene on the surface of the insulating film.

The growing-a-carbon-nano-tube includes: forming a mask pattern to expose a portion of the substrate; increasing the surface energy of the substrate exposed by the mask pattern; and implanting a growth source into the exposed portion of substrate to grow the carbon-nano-tube vertically on the substrate.

The increasing-the-surface-energy-of-the-semiconductor-substrate includes performing a plasma surface treatment using an inert gas on the exposed portion of the substrate by the mask pattern.

The increasing-the-surface-energy-of-the-semiconductor-substrate includes forming a silicon oxide film on the semiconductor substrate.

In the growing-a-carbon-nano-tube, the growth source includes one selected from the group consisting of carbon, hydrogen and combinations thereof.

The implanting-a-growth-source in the growing-a-carbon-nano-tube is performed by a chemical vapor deposition (CVD) process including a plasma enhanced CVD (PECVD), a metal organic CVD (MOCVD), a low pressure CVD (LPCVD) or a high pressure CVD (HPCVD).

The growth source in the growing-a-carbon-nano-tube includes $CH_4$, $C_2H_6$ and $C_4H_8$ gases.

The implanting-a-growth-source in the growing-a-carbon-nano-tube is performed at a temperature ranging from 200 to 1000° C.

The forming-an-insulating-film is performed using a high-K dielectric material.

The forming-an-insulating-film includes forming a zirconium oxide, a lead zirconium titanate (PZT) and a hafnium oxide.

The insulating film includes an oxide film.

The insulating film includes a nitride film.

The insulating film includes a carbonized film.

The forming-an-insulating-film is performed by an atomic layer deposition (ALD) process or a CVD process.

The forming-a-graphene-on-the-surface-of-the-insulating-film includes: forming a catalyst layer on the surface of the insulating film; and implanting a growth source on the catalyst layer to grow the graphene.

The forming-a-catalyst-layer is performed by a CVD process or an ALD process.

The forming-a-catalyst-layer includes forming one selected from the group consisting of Fe, Ni, Co and combinations thereof.

The implanting-a-growth-source-on-the-catalyst-layer-to-grow-the-graphene is performed using one selected from the group consisting of $CH_4$, $C_2H_6$ and $C_4H_8$ gases, a hydrogen gas, an argon gas and combinations thereof.

The growing-a-graphene is performed by a CVD process or an ALD process.

According to another embodiment of the present invention, a semiconductor device comprises: a carbon nano tube pattern formed vertically on a substrate; an insulating pattern formed over the carbon nano tube; and a graphene pattern formed over the insulating film, wherein the carbon nano tube pattern, the insulating pattern, the graphene pattern define a vertical gate pattern on the substrate, the graphene pattern defining a gate electrode.

The insulating pattern includes a first insulating pattern formed over an outer surface of the carbon nano tube pattern; and a second insulating pattern formed over an inner surface of the carbon nano tube pattern.

The graphene pattern includes a first graphene pattern formed over the first insulating pattern, and a second graphene pattern formed over the second insulating pattern.

DESCRIPTION OF EMBODIMENTS

The present invention will be described in detail with reference to the attached drawings.

Figure 1:
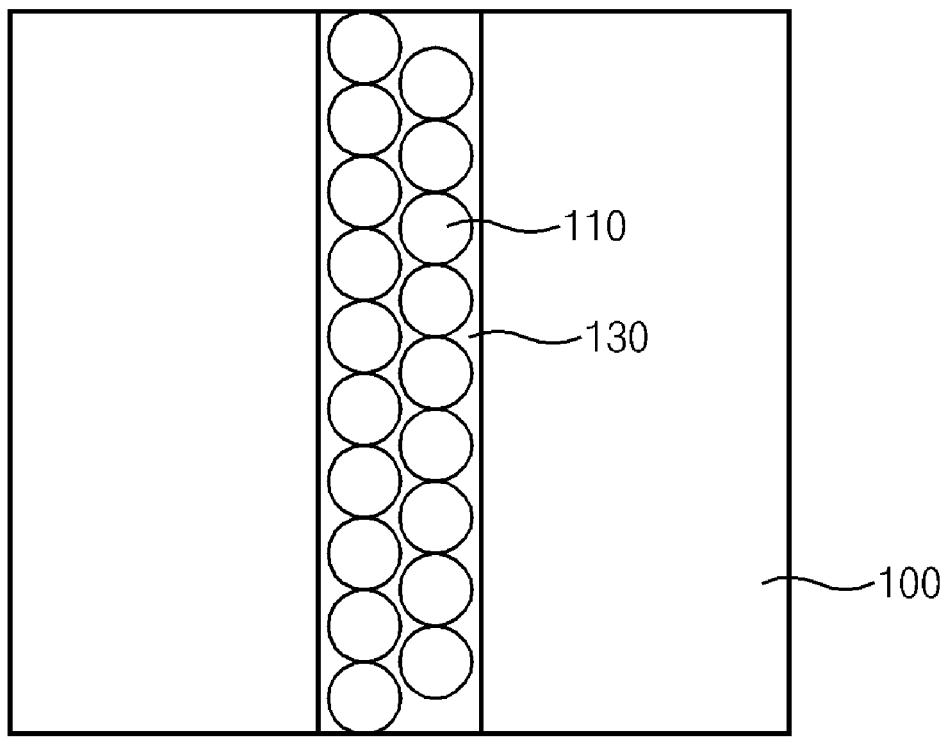
FIG. 1 is a plan view illustrating a semiconductor device according to an embodiment of the present invention.

FIG. 1 is a plan view illustrating a semiconductor device according to an embodiment of the present invention.

Referring to FIG. 1, a semiconductor device includes a carbon nano tube 110 grown on a semiconductor substrate 100, an insulating film 120 (see FIG. 2c) formed in the inside and the outside of the carbon nano tube 110, and a graphene 130 formed on the surface of the insulating film. The carbon nano tube 110 represents a region where a channel is formed. The insulating film 120 represents a gate insulating film, and the graphene 130 represents a gate electrode.

A plasma surface treatment using an inert gas is performed on the semiconductor substrate 100 to grow the carbon nano tube 110 under an atmosphere of carbon, hydrogen or a combination thereof. Since the carbon nano tube 110 is vertically grown, it can provide a structure that can be highly integrated in a narrow area, and easily fabricated free from the limitations accompanied with a conventional exposure process.

The insulating film 120 includes a high-K dielectric material. More specifically, the insulating film 120 includes zirconium oxide, lead zirconium titanate (PZT), hafnium oxides like $SiO_2$, SiON, $SiO_2/Si_3N_4$, TaON, $Ta_2O_5$, $Al_2O_3$, $HfO_2$, $TiO_2$, $SrTiO_3$, (Ba, Sr)$TiO_3$, (Pb, Sr)$TiO_3$, $ZrO_2$, and any combination thereof.

The insulating film 120 includes an oxide film, a nitride film, a carbonized film and the like. The graphene 130 includes a mono layer or a multi layer. The mono layer means a single layered carbon layer, and the multi layer means two or three layered carbon layer.

FIGS. 2a to 2e are cross-sectional diagrams illustrating a method for manufacturing a semiconductor device according to an embodiment of the present invention.

Figure 2A:
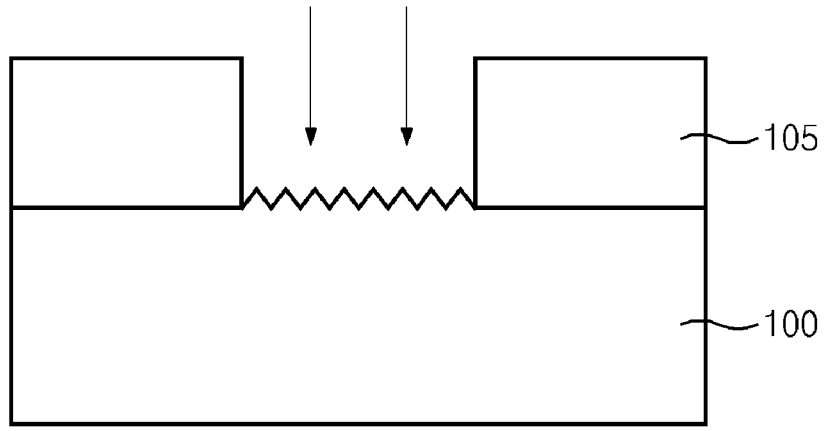
FIGS. 2a to 2e are cross-sectional diagrams illustrating a method for manufacturing a semiconductor device according to an embodiment of the present invention.

Referring to FIG. 2a, a mask pattern 105 is formed on the semiconductor substrate 100. The mask pattern 105 may use a photoresist pattern obtained by performing an exposing and developing process on a photoresist pattern. A plasma surface treatment using an inert gas is performed on the resultant structure including the mask pattern 105 to make the surface of the semiconductor substrate 100 exposed by the mask pattern 105 rough. The mask pattern 105 may be replaced with other materials than the photoresist film so long as the plasma surface treatment using the inert gas can be performed to increase the surface energy of the semiconductor substrate 100. After the mask pattern 105 is formed, the plasma surface treatment using an inert gas is performed on the semiconductor substrate 100 exposed by the mask pattern 105 to increase the surface energy of the semiconductor substrate 100, thereby facilitating vertical growth of the carbon nano tube in the area where the surface energy is increased. The method of increasing the surface energy of the semiconductor substrate 100 is not limited to the way of using the plasma surface treatment, but a method of forming a silicon oxide on the semiconductor substrate may be used instead.

Figure 2B:
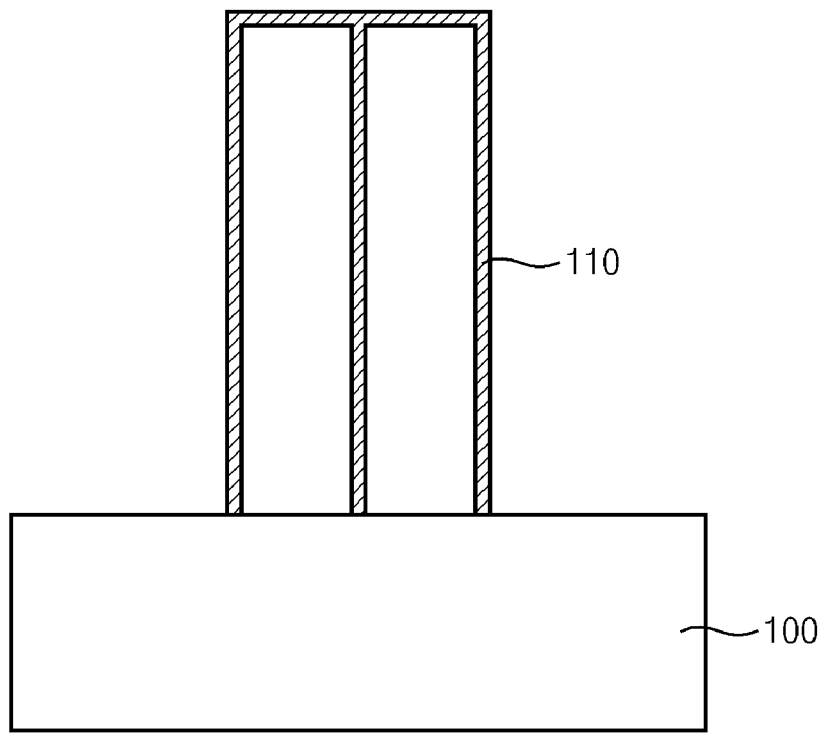

Referring to FIG. 2b, the carbon nano tube 110 is vertically grown on the upper portion of the semiconductor substrate 100 exposed by the mask pattern 105, The carbon nano tube 110 is formed using a carbon-containing source for example, a source containing carbon, and hydrogen.

The carbon nano tube 110 is vertically grown by a physical vapor deposition (PVD) process, a chemical vapor deposition (CVD) process, an atomic layer deposition (ALD) process, furnace, a laser, plasma, vapor phase growth or electrolysis. More preferably, the vertical growth is performed by a plasma enhanced CVD (PECVD) process, a metal organic CVD (MOCVD) process, a low pressure CVD (LPCVD) process or a high pressure CVD (HPCVD) process.

As a reaction gas, a carbon-including gas such as $CH_4$, $C_2H_6$ or $C_4H_8$ gas can be employed. The vertical growth is performed at a temperature ranging from 200 to 1000° C. The carbon nano tube 110 serves as a channel. Since the carbon nano tube 110 has a width in the tens of nanos, a plurality of carbon nano tubes may be formed depending on design of the semiconductor device so that a fine width can be easily formed. Also, the carbon nano tube 110 is vertically grown to secure the channel length, thereby improving the characteristics of the semiconductor device.

Figure 2C:
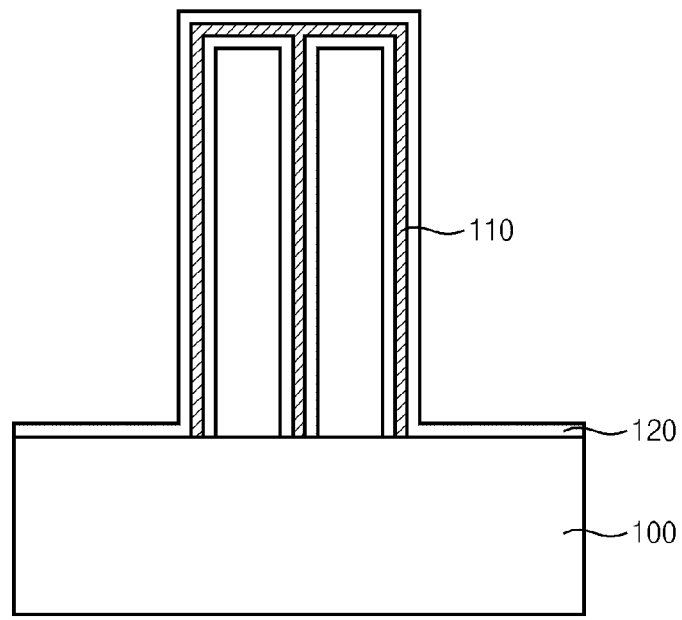

Referring to FIG. 2c, the insulating film 120 is formed on the substrate 100 and the inner surface and the outer surface of the gate-shaped carbon nano tube pattern 110. The insulating film 120 includes a high-K dielectric material. For example, the insulating film 120 can be formed of zirconium oxide, lead zirconium titanate (PZT), hafnium oxides, SiON, $SiO_2$/$Si_3N_4$, TaON, $Ta_2O_5$, $Al_2O_3$, $HfO_2$, $TiO_2$, $SrTiO_3$, (Ba, Sr)$TiO_3$, (Pb, Sr)$TiO_3$, $ZrO_2$, or a combination thereof. The insulating film 120 may include an oxide film, a nitride film or a carbonized film. The insulating film 120 is formed by an ALD process or a CVD process. The above deposition processes allows the insulating film 120 to be uniformly deposited on the inner surface and the outer surface of the carbon nano tube pattern 110. The insulating film 120 may serve as a gate insulating film.

Figure 2D:
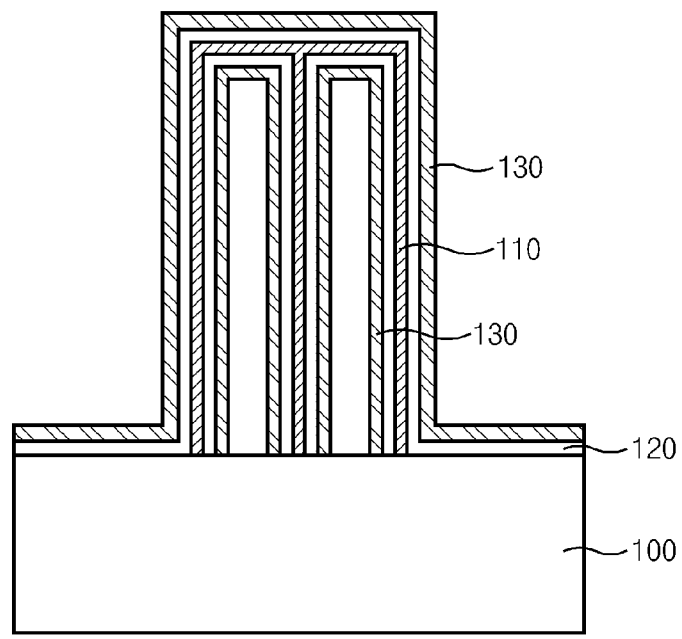

Referring to FIG. 2d, a catalyst layer (not shown) is formed on the the first insulating film and the second insulating films 120 by an ALD process or a CVD process. The catalyst layer may be formed of Fe, Ni, Co or a combination thereof, preferably, a graphene layer. The graphene layer 130 is formed by a CVD process, a PVD process, an ALD process, furnace, electricity, laser or plasma using a carbon-containing source such as $CH_4$, $C_2H_6$ and $C_4H_8$ gases along with hydrogen, argon gas etc. The graphene layer 130 can be formed of a mono layer or a multi layer.

Figure 2E:
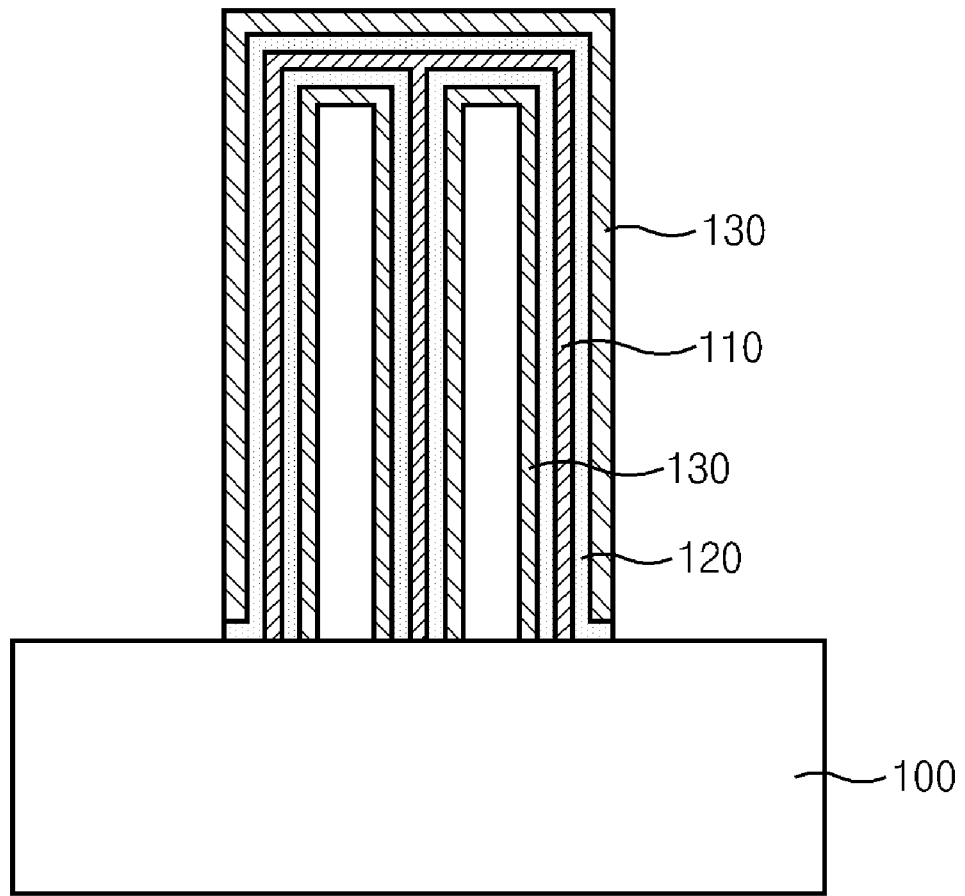

Referring to FIG. 2e, the graphene layer 130 and the insulating layer 120 are etched to form a gate structure. More specifically, the first insulating film 120 and the graphene 130 formed on the upper portion of the semiconductor substrate 100 are removed with the graphene 130 formed in a sidewall of the insulating film 120 formed in a sidewall of the carbon nano tube 110 as an etching mask.

As described above, according to an embodiment of the present invention, a gate body is formed using a carbon nano tube, and an insulating film that serves as a gate insulating film is formed on the gate body. A graphene layer that serves as a gate electrode is grown in the insulating film. Since the carbon nano tube pattern 110 is formed in a gate-shape with a long length, a short channel effect can be prevented. Since the carbon nano tube has a low resistance, when it is employed, a semiconductor device operating at a high speed can be obtained.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a carbon nano tube grown on a substrate;
    a first insulating film formed over an inner surface of the carbon nano tube and a second insulating film formed over an outer surface of the carbon nano tube; and
    a first graphene layer formed over the first insulating film and a second graphene layer formed over the second insulating film,
    wherein the carbon nano tube is disposed between the first graphene layer and the second graphene layer.

2. The semiconductor device according to claim 1, wherein the carbon nano tube is vertically grown over the substrate.

3. The semiconductor device according to claim 1, wherein any of the first and the second insulating films includes a high-K dielectric material.

4. The semiconductor device according to claim 1, wherein any of the first and the second insulating films includes any of a zirconium oxide, a lead zirconium titanate (PZT), and a hafnium oxide.

5. The semiconductor device according to claim 1, wherein any of the first and the second insulating films includes an oxide film.

6. The semiconductor device according to claim 1, wherein any of the first and the second insulating films includes a nitride film.

7. The semiconductor device according to claim 1, wherein any of the first and the second insulating films includes a carbonized film.

8. The semiconductor device according to claim 1, wherein any of the first and the second graphene layers includes is a mono layer.

9. The semiconductor device according to claim 1, wherein any of the first and the second graphene layers includes multiple graphene layers.

10. A method for manufacturing a semiconductor device, the method comprising:
    growing a carbon nano tube on a substrate;
    forming a first insulating film over an inner surface of the carbon nano tube and a second insulating film over an outer surface of the carbon nano tube; and
    forming a first graphene layer over the first insulating film and a second graphene layer over the second insulating film,
    wherein the carbon nano tube is formed between the first graphene layer and the second graphene layer.

11. The method according to claim 10, wherein the growing-a-carbon-nano-tube includes:
    forming a mask pattern to expose a portion of the substrate;
    increasing a surface energy of the exposed portion of the substrate; and
    implanting a growth source into the exposed portion of the substrate to grow the carbon-nano-tube vertically on the substrate.

12. The method according to claim 11, wherein the increasing the surface-energy-of-the-semiconductor-substrate includes performing a plasma surface treatment using an inert gas on the exposed portion of the substrate by the mask pattern.

13. The method according to claim 10, wherein the growing-a-carbon-nano-tube uses a growth source selected from the group consisting of carbon, hydrogen, and combinations thereof.

14. The method according to claim 11, wherein the implanting-a-growth-source in the growing-a-carbon-nano-tube is performed by using a chemical vapor deposition (CVD) process including any of a plasma enhanced CVD (PECVD), a metal organic CVD (MOCVD), a low pressure CVD (LPCVD), and a high pressure CVD (HPCVD).

15. The method according to claim 11, wherein the growth source in the growing-a-carbon-nano-tube includes any of $CH_4$, $C_2H_6$, and $C_4H_8$ gases.

16. The method according to claim 11, wherein the implanting-a-growth-source in the growing-a-carbon-nano-tube is performed at a temperature ranging from 200 to 1000° C.

17. The method according to claim 10, wherein the forming-an-insulating-film is performed using a high-K dielectric material.

18. The method according to claim 10, wherein any of the first and the second insulating films includes any of a zirconium oxide, a lead zirconium titanate (PZT), a hafnium oxide, a silicon oxide film, a silicon nitride film, and a combination thereof.

19. The method according to claim 10, wherein any of the first and the second insulating films includes an oxide film.

20. The method according to claim 10, wherein any of the first and the second insulating films includes a nitride film.

21. The method according to claim 10, wherein any of the first and the second insulating films includes a carbonized film.

22. The method according to claim 10, wherein the step of forming the first and the second insulating films is performed by an atomic layer deposition (ALD) process or a CVD process.

23. The method according to claim 10, wherein the step of forming the first and the second graphene layers includes:
    forming a catalyst layer over any of the first and the second insulating film; and
    implanting a growth source on the catalyst layer to grow any of the first and the second graphene layers.

24. The method according to claim 23, wherein the forming-a-catalyst-layer is performed by using a CVD process or an ALD process.

25. The method according to claim 23, wherein the forming-a-catalyst-layer includes implanting any of Fe, Ni, Co, and a combination thereof.

26. The method according to claim 23, wherein the implanting-a-growth-source-on-the-catalyst-layer-to-grow-the-graphene is performed using a carbon-containing gas and any of a hydrogen gas, an argon gas, and a combination thereof, and wherein the carbon-containing gas includes any of $CH_4$, $C_2H_6$, and $C_4H_8$ gases.

27. The method according to claim 23, wherein the step of growing any of the first and the second graphene layers is performed by using a CVD process or an ALD process.

28. A semiconductor device having a gate pattern, the gate pattern comprising:
    a carbon nano tube pattern formed vertically on a substrate;
    an insulating pattern formed over the carbon nano tube; and
    a graphene pattern formed over the insulating pattern,
    wherein the carbon nano tube pattern, the insulating pattern, the graphene pattern define a vertical gate pattern on the substrate, the graphene pattern defining a gate electrode.

29. The semiconductor device according to claim 28, wherein the insulating pattern includes:
    a first insulating pattern formed over an outer surface of the carbon nano tube pattern; and
    a second insulating pattern formed over an inner surface of the carbon nano tube pattern.

30. The semiconductor device according to claim 29, wherein the graphene pattern includes:
    a first graphene pattern formed over the first insulating pattern; and
    a second graphene pattern formed over the second insulating pattern.

* * * * *